(12) United States Patent
Shin et al.

(10) Patent No.: US 6,391,714 B2
(45) Date of Patent: May 21, 2002

(54) METHOD FOR FABRICATING A CAPACITOR IN A SEMICONDUCTOR MEMORY DEVICE

(75) Inventors: Chul-Ho Shin, Yongin-shi; U In Chung, Seoul, both of (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 09/738,296

(22) Filed: Dec. 18, 2000

(30) Foreign Application Priority Data

Dec. 18, 1999 (KR) .......................................... 99/58993

(51) Int. Cl.$^7$ ......................................... H01L 21/8242
(52) U.S. Cl. ....................................... 438/254; 438/397
(58) Field of Search ..................... 437/52, 60; 438/14, 438/15

(56) References Cited

U.S. PATENT DOCUMENTS 5,409,856 A * 4/1995 Jun .............................. 437/52
5,552,334 A * 9/1996 Tseng ........................... 437/52

* cited by examiner

Primary Examiner—John F. Niebling
Assistant Examiner—Andre C Stevenson
(74) Attorney, Agent, or Firm—Lee & Sterba, P.C.

(57) ABSTRACT

A method for making a capacitor of a semiconductor memory device capable of providing increased capacitance without degraded resolution, as well as without the removal of any interlayer insulation layers upon formation of a lower electrode for the capacitor, wherein after formation of an access transistor on a semiconductor substrate, a first interlayer insulation layer for planarization of a surface of the semiconductor substrate and a second interlayer insulation layer for formation of the capacitor lower electrode are formed. After formation of an opening for exposing a part of an impurity diffusion region of the access transistor by etching a part of the first and second interlayer insulating layers, a spacer is formed within the opening. Further, after deposition of a conductive layer for the capacitor lower electrode onto a surface of the substrate, a planarization process is carried out until a part of the upper surface of the spacer is exposed. Finally, after removal of the exposed spacer, the dielectric layer and a conductive layer for the upper electrode of the capacitor are formed in sequence. The method does not require any additional insulation layer evaporation process, since the interlayer insulation layer for formation of the reverse storage electrode could be used for formation of a gate contact of a logic region, without removal. Consequently, simplification of fabrication process for a capacitor is achieved.

13 Claims, 6 Drawing Sheets

METHOD FOR FABRICATING A CAPACITOR IN A SEMICONDUCTOR MEMORY DEVICE

BACKGROUND OF THE INVENTION

1. Field of the Invention

Figure 1A:
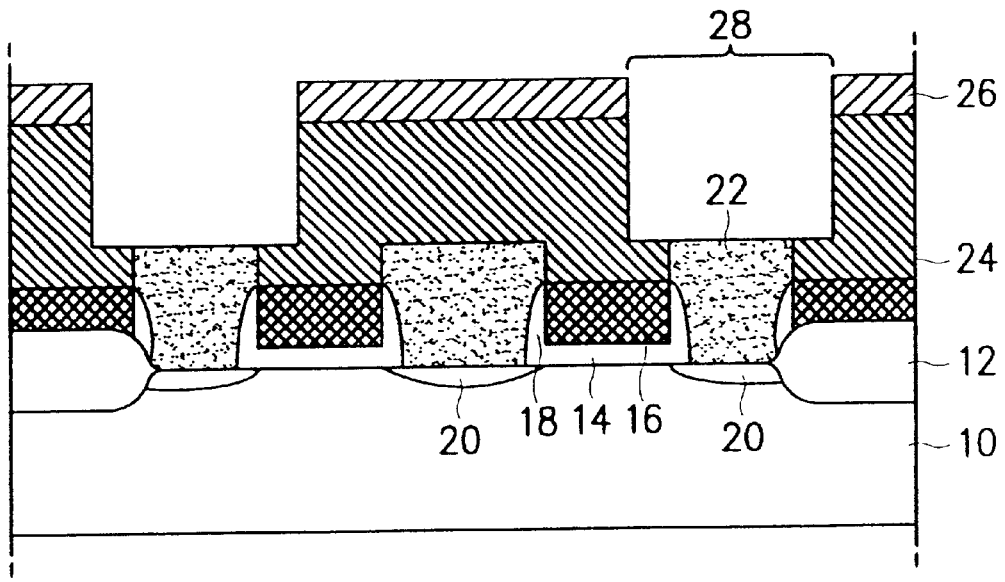

The present invention relates to a method for fabricating a semiconductor device. More particularly, the present invention relates to a method for fabricating a capacitor with increased capacity in a semiconductor memory device.

2. Description of the Related Art

Semiconductor memory devices conventionally include a volatile memory, RAM (Random Access Memory), and a non-volatile memory, ROM (Read Only Memory). It is well known that the data storage capacity of a semiconductor memory device, such as a typical dynamic random access memory (DRAM) device having an access transistor and a capacitor, depends primarily upon a static capacitance of the capacitor used. Therefore, in the case that the capacitance is not full enough, a read error may be often caused during writing and reading data in the memory device. To prevent such a data error from occurring usually entails a refresh operation of re-storing data into the memory device after a lapse of a predetermined duration. As this refresh operation is significantly subject to the capacitance of a memory device, increase of such a capacitance is one of the most important ways for improving the refresh characteristic of the memory device. In the present state of the art, as integration of a semiconductor memory device becomes greater, an area of a unit memory cell per chip becomes smaller. Accordingly, an area capable of fabricating a capacitor in the memory cell is apt to decrease.

In general, capacitance is proportional to a cross-sectional area in contact with a storage electrode, serving as a lower electrode, and a plate electrode, serving as an upper electrode. It is in inversely proportional to a distance between these two electrodes. Accordingly, to form a lower electrode having more surface area available within a limited same substrate area of a semiconductor chip, the state of the art widely used a CUB (Capacitor Under Bit-line) structure forming a capacitor beneath the bit-line, and a COB (Capacitor Over Bit-line) process forming a capacitor over the bit-line. This combination results in the manufacture of a three-dimensional structure of stacked capacitors such as cylinder-type, box-type, fin-type, etc.

In addition to many attempts for improvement of the structure of a lower electrode as discussed above, various other solutions have been proposed in the art to achieve increase of the capacitance. These various other proposals utilize particular physical properties of conductive material used in the lower electrode. One of these proposed solutions is known as a crystal seeding. In a crystal seeding, a lower electrode surface of a capacitor is formed in curved polycrystalline silicon having a hemispherical grain or mushroom-like shape to increase its capacitance. Formation of a hemisphere-type silicon on the lower electrode surface, by using such a crystal seeding method, leads to an increase of the lower electrode surface area by about two to three times in comparison. Thus, the capacitor is able to provide improved capacitance over a usual one having no hemispherical silicon, up to about 1.8 times higher capacitance with a same chip area. Such a Hemi-Spherical Grain (HSG) silicon of lower electrode is disclosed in a publication entitled "*Extended Abstracts of the International Conference on Solid State Device and Materials*" at pages 422 to 424, and also in U.S. Pat. No. 5,385,863 to Tatsumi Toru, et al. These references are hereby incorporated into the present application by reference.

Recently, active research has been performed to develop an MDL (Merged DRAM with Logic) device that incorporates a DRAM device and a logic circuit both manufactured to form a single component. Because this MDL component is formed within a single component, it is well known in the art that it provides significant advantage in terms of integration of semiconductor devices. In practice, it may have a wide range of applications in fabrication of very high scale semiconductor memory devices. Such an MDL device, however, is subject to a certain design rule or some limitation in design, which frequently causes an undesirable increase of evaporation depth in an insulation layer for forming a conductive layer for a capacitor lower electrode if more capacitance is to be pursued upon manufacturing of a stacked capacitor. As a result, a so-called step difference (coverage) from peripheral component regions becomes more critical, so it may often lead to a disadvantage that resolution deteriorates in a photo-lithographic etching process for patterning a thickened conductive layer.

Accordingly, the present state of the art recently departed from the conventional method of making a capacitor lower electrode by means of patterning it after overall evaporation of the conductive layer. Now, the current state of the art tends to prefer a sort of reverse patterning process of making the capacitor lower electrode by forming an opening for a capacitor lower electrode in an insulation layer and then filling up the opening with the conductive layer.

Referring now to FIGS. 1a to 1d, a prior art method for making a CUB type of capacitor will be explained. FIG. 1a illustrates an active region of a semiconductor substrate 10 having a component isolation layer 12. Additionally, a polycrystalline silicon layer 16 is formed through a gate oxide layer 14 to form a gate region. Subsequent to the formation of a spacer 18 with an insulation layer in a side wall of the polycrystalline silicon layer 16, an impurity diffusion region 20 serving as a source and a drain is then formed. The impurity diffusion region 20 is formed by utilizing the gate region of the spacer 18 as a self-aligned ion implantation mask, thereby finalizing an access transistor.

Consequently, after overall evaporation of a conductive layer onto the above resulting component, a photo-lithographic etching process is performed thereon to form a landing pad 22 contacting the impurity diffusion region 20 between the gate regions. Thereafter, by using Chemical Vapor Deposition (CVD), the evaporation of Phosphorus Silicon Glass (PSG), Boron Phosphorus Silicon Glass (BPSG), or Undoped Silicon Glass (USG) is applied to form an interlayer insulation layer 24. Next, a silicon nitride layer 26 is formed on this insulation layer 24. Further, an opening 28 is formed through the silicon nitride layer 26 and interlayer insulation layer 24 to expose the landing pad 22 by using a photosensitive pattern (not shown). More particularly, the landing pad is in contact with the source region of the impurity diffusion region 20.

Figure 1B:
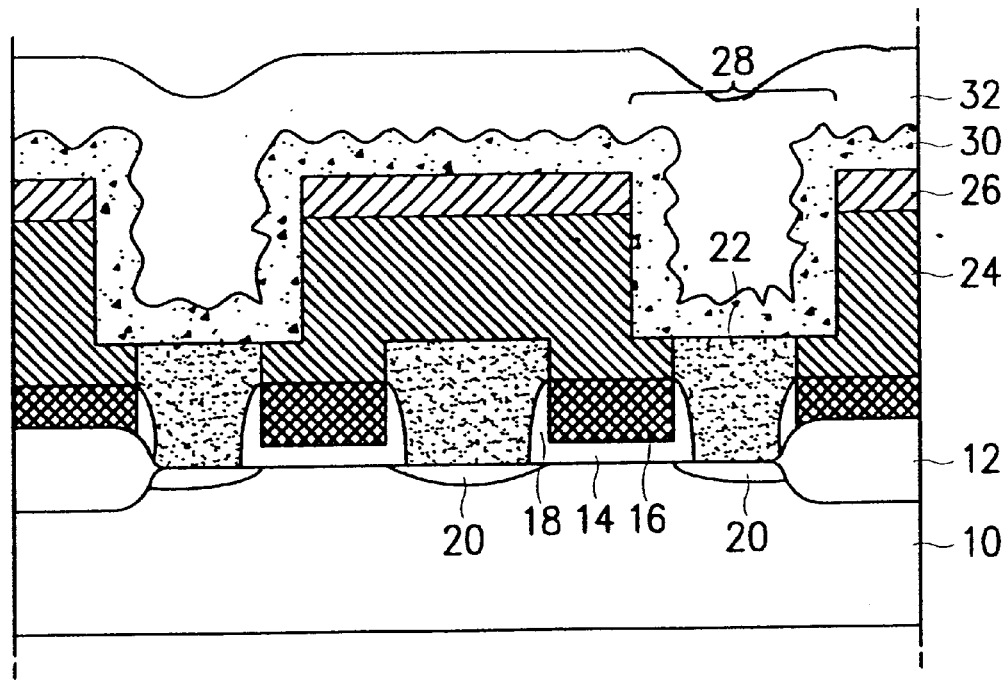

Referring to FIG. 1b, it is shown that a conductive layer, having a depth of about 1,000 angstrom, and serving as a lower electrode of a capacitor, is formed entirely on a semiconductor substrate 10 having an opening 28 thereon, and the impurities are then to be implanted thereto. Thereafter, a known crystal seeding is introduced to make a growth of hemispherical silicon on the surface of the conductive layer for forming a lower electrode 30 of the capacitor. Then, an oxide layer 32 is further formed on this resultant layer of the lower electrode.

Figure 1C:
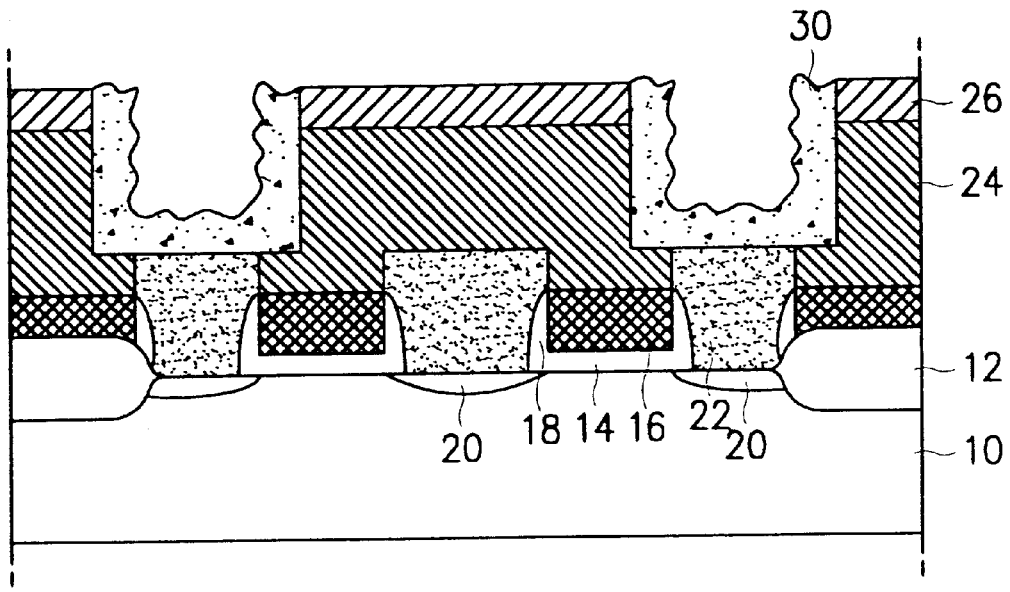

As shown in FIG. 1c, a planarization process such as etch-back or CMP is performed onto the resultant layer of oxide layer 32, preferably until a silicon nitride layer 26 is exposed. Next, the oxide layer 32 is completely removed through a wet etching process.

Figure 1D:
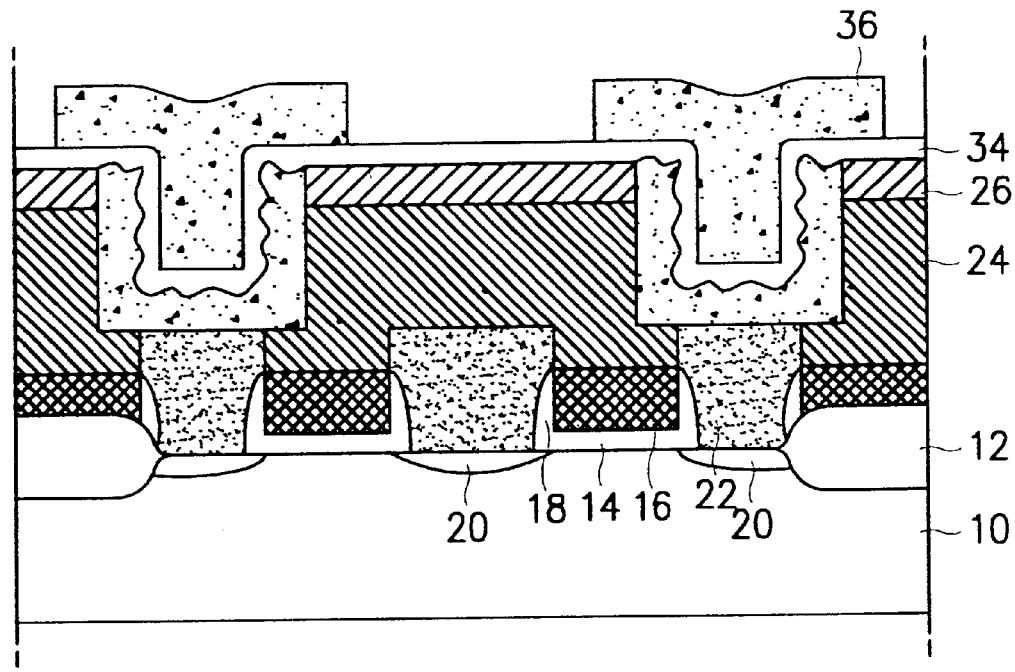

Referring finally to FIG. 1d, an oxide-nitride-oxide (ONO) layer 34 serving as a high dielectric substance layer on the aforementioned resultant layer is formed. The formation of this ONO layer may be made from a series of processes as follows: for example, first performing an oxidation process for 30 seconds at a temperature of 750° C. to form an oxide layer having a depth of about 10 angstrom; then, forming a nitride layer having a depth of about 55 angstrom or less on the oxide layer; and performing a second oxidation process for about 30 seconds at the same temperature to form an oxide layer having a depth of about 10 angstrom; next, polycrystalline silicon is evaporated onto the ONO layer; and then, by patterning the polycrystalline silicon layer, a plate electrode 36 serving as an upper layer of a capacitor is formed.

According to the aforementioned prior art method for CUB capacitor, there may be some advantages in that it may prevent degrading of resolution by depth of the conductive layer for a lower electrode of a capacitor since it utilizes a reverse patterning. It still has a critical disadvantage, however, of a decrease of capacitance in the capacitor. Further, in case the interlayer insulation layer 24 and the silicon nitride layer 26 are removed to obtain more capacitance, an evaporation process for the interlayer insulation layer should be performed once again in order to make a contact to a gate in the logic region. Thus, this will lead to significant difficulties in manufacturing the capacitors of the current state of the art.

SUMMARY OF THE INVENTION

It is therefore a feature of an embodiment of the present invention to provide a method for making a capacitor having increased capacitance without degraded resolution of a semiconductor memory device.

It is another feature of an embodiment of the present invention to provide a method for making a capacitor of a semiconductor memory device having increased capacitance without removal of any interlayer insulation layers upon formation of a lower electrode by using a reverse patterning method.

According to one aspect of the present invention, the method for fabricating a capacitor of a semiconductor memory device having a dielectric layer between a lower electrode and an upper electrode, includes the steps of:
  after formation of an access transistor on a semiconductor substrate, forming a first interlayer insulation layer for planarization of a surface of the semiconductor substrate and a second interlayer insulation layer for formation of the capacitor lower electrode;
  after formation of an opening for exposing a part of an impurity diffusion region of the access transistor by etching a part of the first and second interlayer insulation layers, forming a spacer within the opening;
  after deposition of a conductive layer for the capacitor lower electrode onto a surface of the substrate on which the spacer is formed, performing a planarization process until a part of an upper surface of the spacer is exposed; and
  after removal of the exposed spacer, forming the dielectric layer and the conductive layer for the upper electrode of the capacitor, in sequence.

According to a further aspect to the present invention, the method for fabricating a capacitor of a semiconductor memory device having a dielectric layer between a lower electrode and an upper electrode, includes the steps of:
  after formation of an access transistor on a semiconductor substrate having at least a top surface, forming a landing pad contacting an impurity diffusion region of the access transistor;
  depositing a first interlayer insulation layer for planarization of a surface of the semiconductor substrate in which the landing pad is formed;
  depositing a second interlayer insulation layer for formation of the capacitor lower electrode on the first interlayer insulation layer, and then forming an opening for exposing the landing pad in contact with a part of the impurity diffusion region of the access transistor;
  after deposition of an insulation layer onto the top surface of the substrate, etching the insulation layer, and thereby forming a spacer in an inner wall of the opening;
  after deposition of a conductive layer for the capacitor lower electrode onto the top surface of the substrate on which said spacer is formed, performing a planarization process until a part of an upper surface of the spacer is exposed; and
  after removal of the exposed spacer, forming the dielectric layer and the conductive layer for the upper electrode of the capacitor, and then forming a bit line in the landing pad contacting a part of the impurity diffusion region of the access transistor.

According to still another aspect of the present invention, the method for fabricating a capacitor of a semiconductor memory device includes the steps of:
  after formation of an access transistor on a semiconductor substrate, forming a landing pad contacting an impurity diffusion region of the access transistor;
  depositing a first interlayer insulation layer for planarization of a surface of the semiconductor substrate in which the landing pad is formed;
  after forming an opening in the first interlayer insulation layer, forming a bit line in a part of the impurity diffusion region of the access transistor by forming a conductive material;
  depositing a second interlayer insulation layer on the semiconductor substrate in which the bit line is formed, and thereon a third interlayer insulation layer for formation of the capacitor lower electrode;
  after forming an opening in a given region of the third interlayer insulation layer, forming a spacer inside the opening;
  forming a contact plug in the landing pad contacting the part of the impurity diffusion region of the access transistor by etching the first and second interlayer insulation layers exposed through the opening;
  after deposition of a conductive layer for the capacitor lower electrode onto the substrate in which the contact plug has been formed, performing a planarization process until a part of the upper surface of the spacer is exposed; and
  after removal of the partially exposed spacer, forming a conductive layer for the capacitor upper electrode and the dielectric layer.

BRIEF DESCRIPTION OF THE ATTACHED DRAWINGS

Figure 2A:
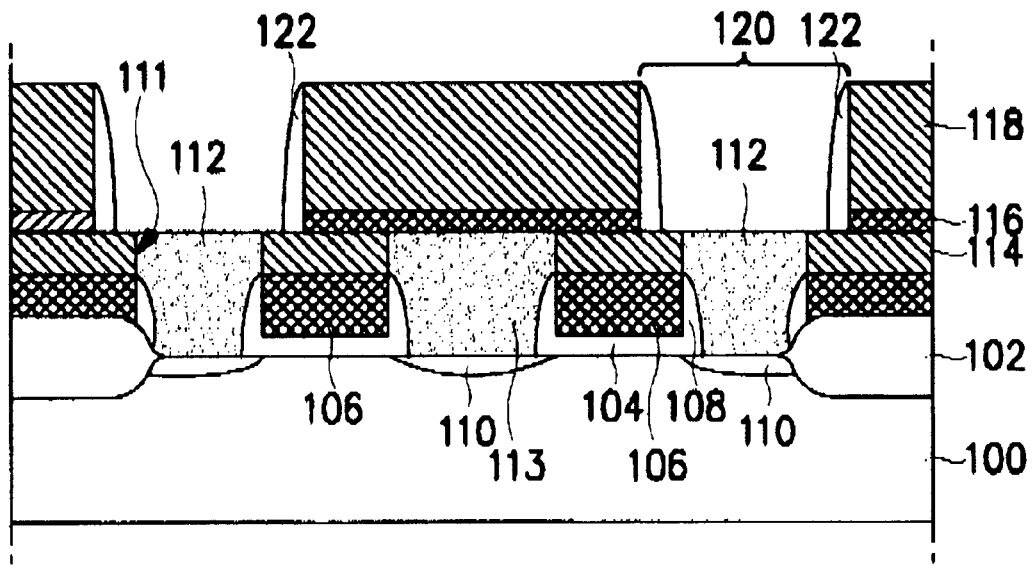
Figure 2B:
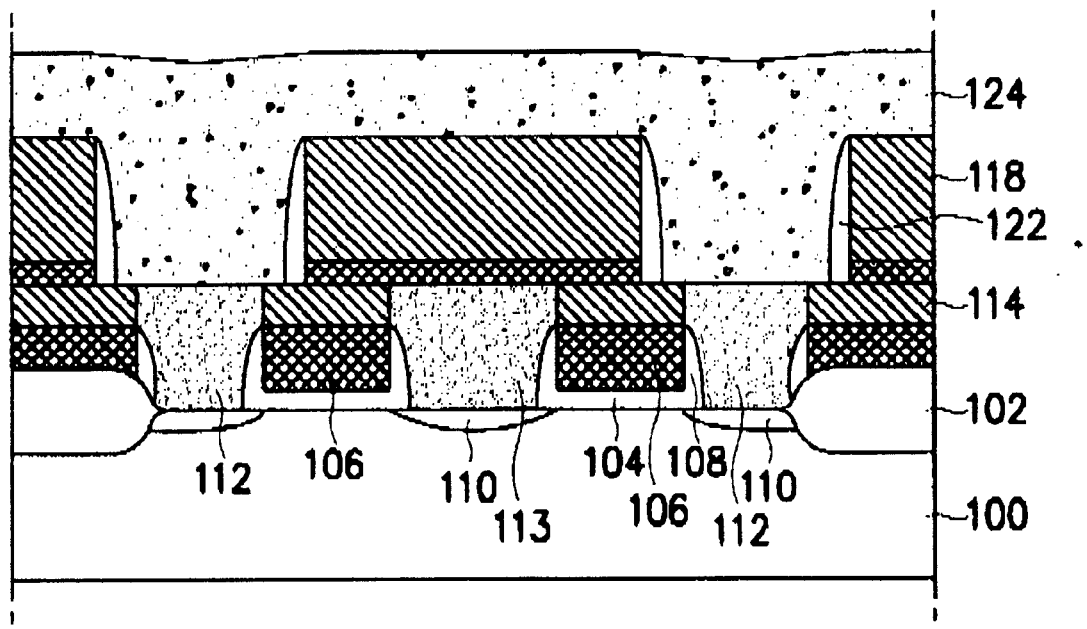
Figure 2C:
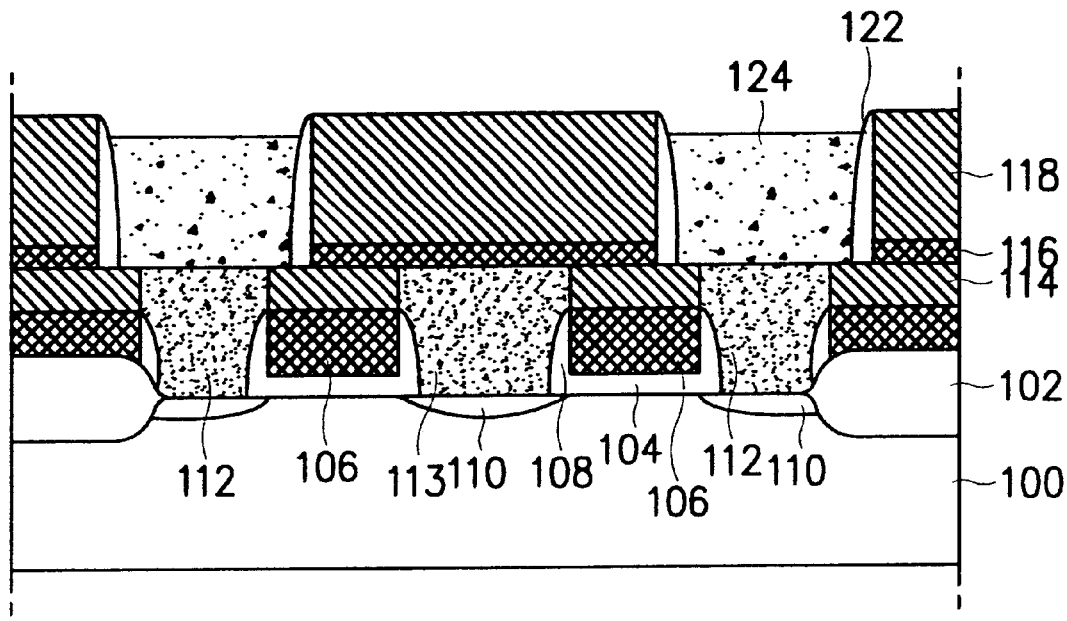
Figure 2D:
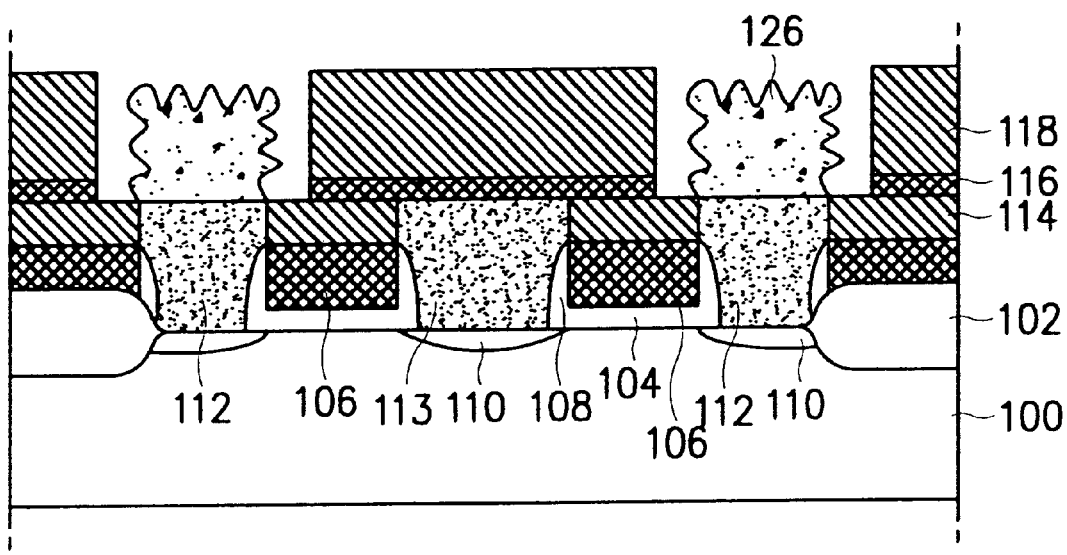
Figure 2E:
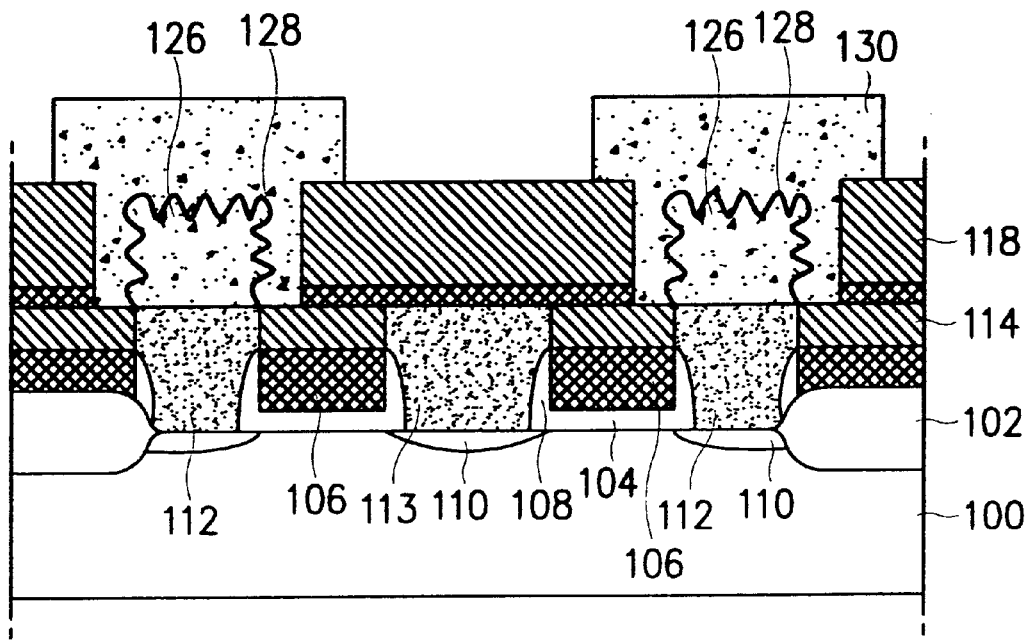
Figure 2F:
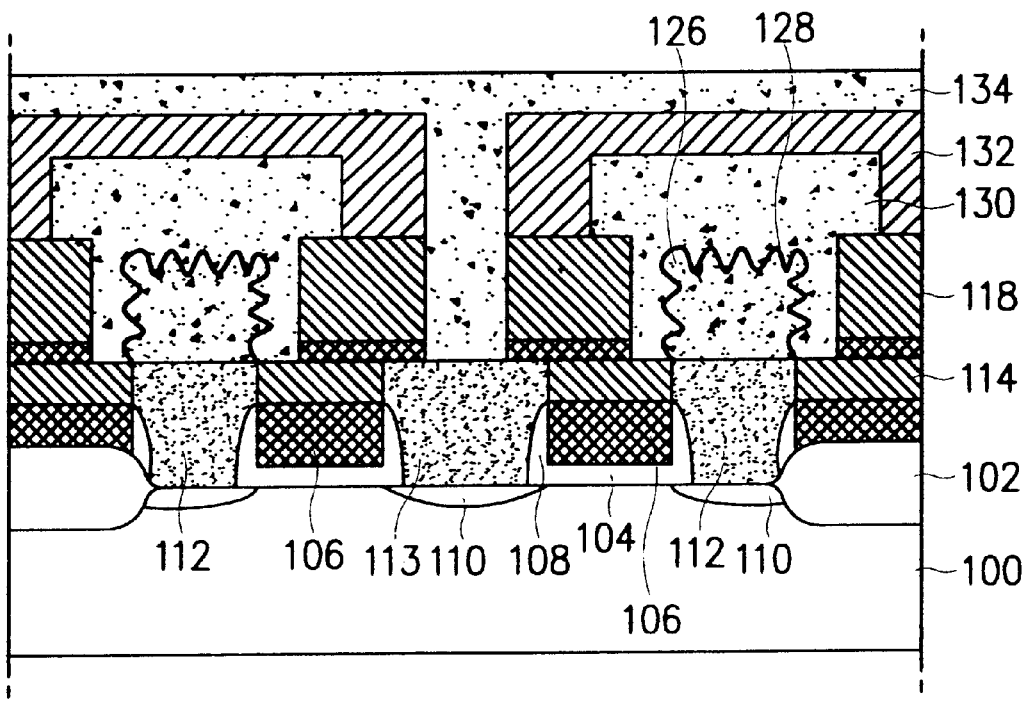
Figure 3A:
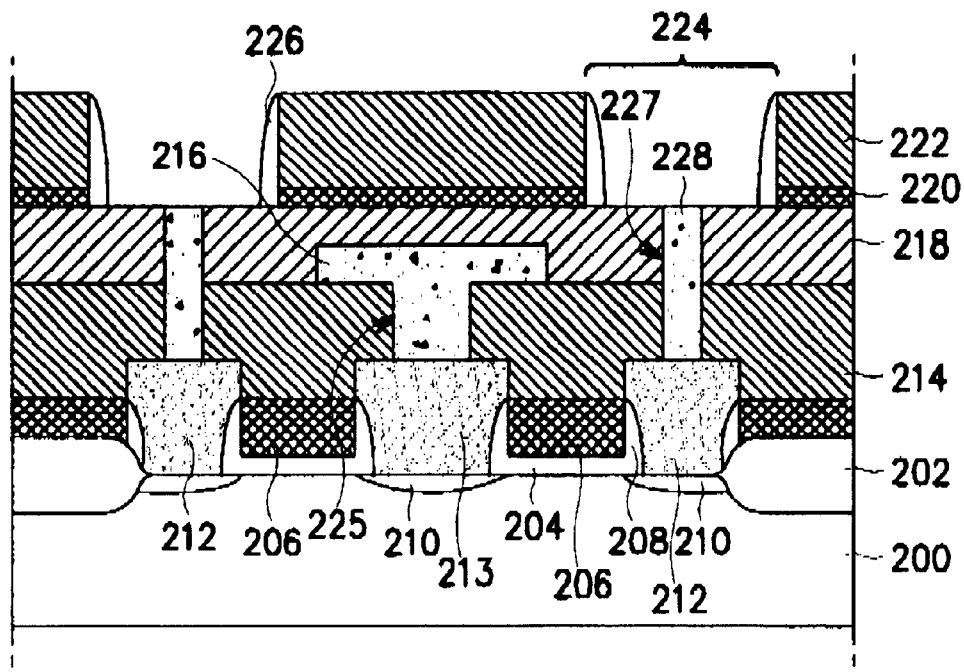
Figure 3B:
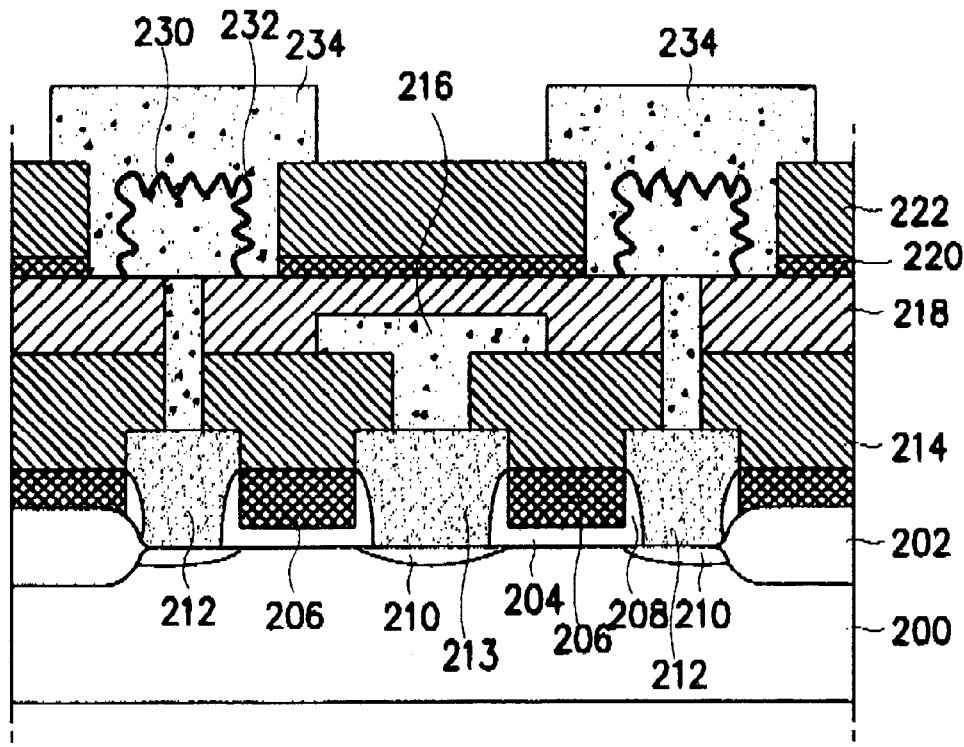

FIGS. 1a to 1d are cross-sectional views of a semiconductor substrate illustrating a prior art method for making a capacitor of CUB structure;

FIGS. 2a to 2f are cross-sectional views of a semiconductor substrate illustrating a method of making a capacitor of CUB structure according to a preferred embodiment of the present invention; and FIGS. 3a and 3b are cross-sectional views of a semiconductor substrate illustrating a method of making a capacitor of COB structure according to an alternate preferred embodiment of the present invention.

DETAILED DESCRIPTION OF PREFERRED EMBODIMENTS

Korean patent application number 58993/1999, filed on Dec. 18, 1999, and entitled: "Method for Fabricating a Capacitor in a Semiconductor Memory Device," is incorporated herein in its entirety.

The present invention will now be described in greater detail with reference to the drawings attached hereto only by way of example.

Referring now to FIG. 2a, a conventional component isolation process is performed onto a p-type semiconductor substrate 100 doped with impurities such as boron. More particularly, this process is a local oxidation of silicon (LOCOS) or an improved LOCOS process, in order to form a field oxide layer 102 to isolate an active region and an inactive region in the semiconductor substrate 100. Then, after fabrication of a gate oxide layer 104 from a dry or wet oxidation process onto the active region of the substrate 100, a polycrystalline conductive layer 106 is formed thereon to fabricate a gate region. A side-wall spacer 108 is formed in a side wall of the polycrystalline silicon layer 106 utilizing an insulation layer, and then by using the gate region on which the spacer 108 has been formed as a self-aligned ion-implantation mask, an ion implantation of impurities of valence 5 such as phosphorus is performed to form an impurity diffusion region 110 serving as a source or drain for a semiconductor access transistor device. Here, the gate region may be fabricated in a stacked structure of a doped polycrystalline silicon layer and a metal silicide layer other than the polycrystalline silicon layer 106 as previously mentioned.

Continuously, after entirely applying an evaporation of a conductive layer on the above fabricated surface, a photolithographic and etching process is then performed to make landing pads 112 and 113 contacting the impurity diffusion region 110 in between the gate regions. Thereafter, an evaporation layer of PSG, BPSG or USG is applied on the resulting fabricated product in which the access transistor is formed by using CVD process so as to fabricate a first interlayer insulation layer 114.

Continuously, an evaporation layer of PSG (phosphorus Silicon Glass), BPSG (Boron Phosphorus Silicon Glass), or USG (undoped silicon Glass) is applied on the resulting fabricated product by using a CVD (Chemical Vapor Deposition) process so as to fabricate a first interlayer insulation layer 114 for planarization of a surface of the semiconductor substrate. Thereafter, an opening 111 which exposes the impurity diffusion region 110 is formed by using a photosensitive pattern (not shown). After entirely applying an evaporation of a conductive layer on the resulting fabricated product in which the opening is formed, a CMP (Chemical Metallical Polishing) or Etch back process is then performed to make landing pads 112 and 113 contacting the impurity diffusion region 110 in between the gate regions. Next, an etching stopper layer 116 is made onto the resulting fabricated product by means of evaporation of a silicon nitride layer in order to prevent the first interlayer insulation layer 114 from being impaired due to any subsequent etching process. Preferably, a depth of this etching stopper layer may be no more than about 500 angstrom.

Then, an evaporation layer of PSG, BPSG or USG is once again applied on the resulting fabricated product in which the etching stopper layer 116 is formed by using CVD process in order to fabricate a second interlayer insulation layer 118 for a reverse storage electrode. Then, by means of a photosensitive pattern (not shown), an opening 120 for exposing the landing pad is formed, more particularly, a landing pad 112 in contact with the source region of the impurity diffusion region 110. Here, in the case where the substrate 100 is of n-type doped with impurities of the valence 5, the opening will be in fact an opening adapted to expose the landing pad contacting the drain region of the impurities diffusion region. Thereafter, the silicon nitride layer is evaporated thereon in a depth of about 600 angstrom or more and it is then etched-back to form a spacer 122 within the opening 120, as seen in the drawing.

In FIG. 2b, a conductive material is evaporated onto a whole surface of the resulting fabricated product in which said spacer has been formed to form a capacitor lower electrode, for example, a polycrystalline silicon layer 124.

In FIG. 2c, a planarization process such as Chemical Metallic Polishing (CMP) or Etch-back is performed onto the resulting fabricated product in which said polycrystalline silicon layer 124 has been evaporated. Preferably, this planarization process may be continuously carried out until a part of the upper surface of the spacer 122 becomes exposed.

Referring now to FIG. 2d, the exposed part of the spacer 122 is removed by means of a conventional wet etching process and a curved reverse storage electrode 126 serving as a lower electrode of a capacitor is then formed by application of a crystal seeding method to the polycrystalline silicon layer 124. To put it another way, a surface of the polycrystalline silicon layer 124 is washed out and a natural oxide layer is removed by using diluted boric acid. Subsequently, a wafer is put into a chamber of highly vacuumed CVD equipment in which the conventional crystal seeding and heat treatment are carried out, so that hemispherical crystal particles grow on the surface of the polycrystalline silicon layer 124, thereby forming a hemispherical silicon pattern 126. More specifically, the chamber of CVD equipment is kept in a state of very high vacuum, about $10^{-9}$ Torr or so, and the substrate is heated to a fixed temperature between 500° C. and 620° C. A type of source gas such as silane ($SiH_4$) or disilane ($Si_2H_6$) is subsequently supplied to the substrate so that crystal cores are produced. Following formation of these crystal cores, a heat treatment is then applied thereto under the above very high vacuum environment, so that each of the crystal cores grows to a hemispherical crystal particle.

In FIG. 2e, an insulation layer of high dielectric coefficient, for example, oxide-nitride-oxide (ONO) layer 128 and a polycrystalline silicon conductive layer on the hemispherical silicon pattern 126 are sequentially formed. Thereafter, a patterning onto the conductive layer is accomplished by photo-lithographic and etching process, and a plate electrode 130 serving as upper electrode of a capacitor is formed thereon to consequently constitute a capacitor.

Referring now to FIG. 2f, an evaporation layer of PSG, BPSG, USG or the like is applied on the entire top surface of the substrate 100 in which the capacitor has been formed by using CVD process in order to fabricate a third interlayer insulation layer 132. Then, an opening for exposing the landing pad 113 in contact with the drain region of the impurity diffusion region of the access transistor, as previously mentioned, is formed. Subsequently, a bit line 134 is formed by evaporation of the conductive layer. For instance, the bit line 134 may be formed by using doped polycrystalline silicon, metal, polycide, silicide or the like.

As described in the foregoing, it will be appreciated by one of ordinary skill in the art that a preferred embodiment of the present invention enables the formation of a reverse storage electrode 126 without removal of the second interlayer insulation layer 118, so it can not only provide a capacitor with more capacitance but also make it unnecessary to separately carry out an additional insulation layer evaporation process for formation of a contact in a logic region of a semiconductor device.

FIGS. 3a and 3b are cross-sectional views of a semiconductor substrate illustrating a method of making a capacitor of COB structure according to an alternate preferred embodiment of the present invention.

Referring initially to FIG. 3a, similar fabrication processes are to be performed as those of the CUB structured capacitor of a semiconductor memory device, according to which processes a field oxide layer 202, a gate oxide layer 204, a polycrystalline silicon conductive layer 206, a spacer 208 and a impurity diffusion region 210 are formed onto a p-type semiconductor substrate 200, thereby constituting an access transistor. Continuously, after entirely applying an evaporation of a conductive layer on the above fabricated surface, photo-lithographic and etching process is then performed to make landing pads 212 and 213 contacting the impurity diffusion region 210 in between the gate regions. Thereafter, an evaporation layer of PSG, BPSG or USG is applied on the resulting fabricated product in which the access transistor is formed by using the conventional CVD process so as to fabricate a first interlayer insulation layer 214. After forming an opening that exposes the landing pad 213 in contact with the drain region of the access transistor that is disposed between the first interlayer insulation layers 214, a conductive layer is formed to constitute a bit line 216. Next, an evaporation layer of PSG, BPSG or USG is once again applied on the resulting fabricated product in which the bit line 216 is formed by using the CVD process in order to thereby fabricate a second interlayer insulation layer 218. Then, after forming an opening 227 which exposes the landing pad, more specifically, the landing pad 212 in contact with a source region of the impurity diffusion region 110 by using a photosensitive pattern, a contact plug 228 to be connected with a storage electrode as a lower electrode of a capacitor is formed in the opening 227 by filling the opening 227 with a conductive material. Continuously, an etching stopper layer 220 is made onto the resulting fabricated product by means of applying evaporation of a silicon nitride layer in order to prevent the second interlayer insulation layer 218 from being impaired due to any subsequent etching processes. Preferably, a depth of this etching stopper layer may be no more than about 500 angstrom.

Next, an evaporation layer of PSG, BPSG or USG is further applied on the resulting fabricated surface of the etching stopper layer 220 by using the same CVD process so as to fabricate a third interlayer insulation layer 222 for forming a reverse storage electrode. Then, photo-lithography and etching process is performed to make an opening 224. Thereafter, the silicon nitride layer is evaporated thereon in a depth of about 600 angstrom or more and is then etched-back to form a spacer 226 within the opening 224, as seen in FIG. 3a. Then, an opening exposing the landing 212 in contact with the source region of the access transistor is formed, and within the opening 224 a contact plug 228 to be connected to a storage electrode is formed, which is the lower electrode of the capacitor. This formation is accomplished by filling up the conductive material.

In FIG. 3b, a polycrystalline silicon layer is evaporated onto a whole surface of the resulting fabricated product in which the contact plug 228 has been formed, and then a planarization process, such as Chemical Metallic Polishing (CMP) or Etch-back, is performed. Preferably, this planarization process may be continuously carried out until a part of the upper surface of the spacer 226 becomes exposed. Then, the exposed part of the spacer 226 is removed by means of a conventional wet etching process, and a curved reverse storage electrode 230, serving as a lower electrode of a capacitor, is then formed by application of a crystal seeding method for the polycrystalline silicon layer. Subsequently, on the reverse storage electrode 230, an insulation layer of high dielectric coefficient, for example, oxide-nitride-oxide (ONO) layer 232, and then a plate electrode 234, serving as the upper electrode of the capacitor, are formed.

As understood in the above, one of ordinary skill in the art will also appreciate that the second embodiment of the present invention makes it possible to form a reverse storage electrode 126 without the removal of the third interlayer insulation layer 222, so it can not only provide a capacitor of a semiconductor memory device with more capacitance but also make it unnecessary to carry out an additional insulation layer evaporation process for the formation of a contact hole in a logic region of the semiconductor device.

As is apparent from the foregoing description, the capacitor according to the present invention can provide more capacitance effectively without requiring the removal of any interlayer insulation layer for forming a reverse storage electrode, owing to forming a spacer within the interlayer insulation layer and subsequently removing the spacer. Further, the process does not require any additional insulation layer evaporation process, since the interlayer insulation layer for formation of the reverse storage electrode could be used for formation of a gate contact of a logic region, without removal. Consequently, simplification of the fabrication process for a capacitor of a semiconductor memory device is achieved.

While the present invention has been described in connection with specific embodiments accompanied by the attached drawings, it will be readily apparent to one of ordinary skill in the art that various changes and modifications may be made thereto without departing from the sprit and scope of the present invention.

What is claimed is:

1. A method for fabricating a capacitor of a semiconductor memory device having a dielectric layer between a lower electrode and an upper electrode, said method comprising:

after formation of a transistor on a semiconductor substrate, forming a first interlayer insulation layer for planarization of a surface of the semiconductor substrate and a second interlayer insulation layer for formation of the capacitor lower electrode;

after formation of an opening for exposing a part of an impurity diffusion region of said transistor by etching a part of said first and second interlayer insulation layers, forming a spacer having at least an upper surface within said opening;

after deposition of a conductive layer for the capacitor lower electrode onto a surface of the substrate on which said spacer is formed, performing a planarization process until a part of the upper surface of the spacer is exposed; and after removal of the exposed spacer, forming the dielectric layer and a conductive layer for the upper electrode of the capacitor, in sequence.

2. The method as claimed in claim 1, further comprising forming a curved polycrystalline silicon layer on a surface of the conductive layer for the capacitor lower electrode.

3. The method as claimed in claim 1, wherein said spacer is formed of silicon nitride.

4. The method as claimed in claim 3, wherein said spacer is removed by using a wet etching process.

5. The method as claimed in claim 1, further comprising forming an etching stopper layer for preventing the first interlayer insulation layer from being impaired due to any subsequent process for forming the opening between said first and second interlayer insulation layers.

6. The method as claimed in claim 5, wherein said etching stopper layer is formed of silicon nitride.

7. The method as claimed in claim 1, further comprising a method of forming a bit line following formation of the capacitor upper electrode.

8. The method as claimed in claim 1, further comprising a method of forming a bit line following formation of a landing pad formed in-between gate regions of the transistor.

9. The method as claimed in claim 1, wherein said opening is formed of an opening exposing either a source region or a drain region of impurity diffusion of said access transistor.

10. The method as claimed in claim 1, wherein said first and second interlayer insulation layers each are made of a material selected from the group consisting of Phosphorus Silicon Glass (PSG), Boron Phosphorus Silicon Glass (BPSG), and Undoped Silicon Glass (USG).

11. A method for fabricating a capacitor of a semiconductor memory device having a dielectric layer between a lower electrode and an upper electrode, said method comprising:

after formation of a transistor having an impurity diffusion region on a semiconductor substrate, forming a first interlayer insulation layer for planarization of a top surface of the semiconductor substrate in which the transistor is formed;

after formation of an opening on the impurity diffusion region of the transistor, forming a landing pad contacting the impurity diffusion region of the transistor;

depositing a second interlayer insulation layer for formation of the capacitor lower electrode on the first interlayer insulation layer and the landing pad, and then forming an opening for exposing the landing pad in contact with a part of the impurity diffusion region of the transistor;

after deposition of an insulation layer onto the top surface of the substrate, etching the insulation layer, and thereby forming a spacer having an upper surface in an inner wall of the opening;

after deposition of a conductive layer for the capacitor lower electrode onto the top surface of the substrate on which said spacer is formed, performing a planarization process until a part of the upper surface of the spacer is exposed; and after removal of the exposed spacer, forming the dielectric layer and a conductive layer for the upper electrode of the capacitor.

12. A method for fabricating a capacitor of a semiconductor memory device having a dielectric layer between a lower electrode and an upper electrode, said method comprising:

after formation of a transistor on a semiconductor substrate, forming a landing pad contacting an impurity diffusion region of the transistor;

depositing a first interlayer insulation layer for planarization of a surface of the semiconductor substrate in which the landing pad is formed;

after forming an opening in the first interlayer insulation layer, forming a bit line connected with a part of the impurity diffusion region of the transistor by forming a conductive material;

depositing a second interlayer insulation layer on the semiconductor substrate in which the bit line is formed;

after forming a contact hole which exposes a part of a surface of the landing pad by etching a part of the first and second interlayer insulation layers, filling the contact hole with a conductive material, the conductive material having at least an upper surface;

after forming a third interlayer insulation layer on the resulting fabricated product and forming an opening in a given region of the third interlayer insulation layer so that the upper surface of the conductive material in the contact hole is exposed, forming a spacer inside the opening, the spacer having at least an upper surface;

after deposition of a conductive layer for the capacitor lower electrode on the resulting fabricated product, performing a planarization process until a part of the upper surface of the spacer is exposed; and after removal of the partially exposed spacer, forming a conductive layer for the capacitor upper electrode and the dielectric layer.

13. The method as claimed in claim 11, further comprising forming a bit line on the landing pad in contact with a part of the impurity diffusion region of the transistor.

* * * * *